(12) United States Patent
Kawashima et al.

(10) Patent No.: US 6,761,790 B2
(45) Date of Patent: Jul. 13, 2004

(54) WIRING BOARD AND METHOD OF MANUFACTURING THE SAME

(75) Inventors: Toshiyuki Kawashima, Ibaraki (JP); Nobuharu Tahara, Ibaraki (JP); Kenichi Ikeda, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 110 days.

(21) Appl. No.: 10/136,053

(22) Filed: Apr. 30, 2002

(65) Prior Publication Data

US 2002/0164467 A1 Nov. 7, 2002

(30) Foreign Application Priority Data

May 1, 2001 (JP) .................................... 2001-134117

(51) Int. Cl.⁷ .............................................. H05K 1/03
(52) U.S. Cl. ............... 156/247; 156/307.1; 156/307.3; 156/344; 427/96; 427/97
(58) Field of Search ................................ 156/247, 344, 156/249, 307.1, 307.3; 427/96, 97; 428/473.5, 474.4; 174/250, 262

(56) References Cited

U.S. PATENT DOCUMENTS

| | | | |
|---|---|---|---|
| 5,346,750 A | | 9/1994 | Hatakeyama et al. |
| 5,851,646 A | * | 12/1998 | Takahashi et al. ........ 428/294.1 |
| 6,300,576 B1 | * | 10/2001 | Nakamura et al. .......... 174/261 |
| 6,523,258 B2 | * | 2/2003 | Kawamoto et al. ............ 29/852 |
| 6,596,406 B2 | * | 7/2003 | Ikeda et al. ............... 428/474.4 |
| 2001/0032700 A1 | | 10/2001 | Nishi et al. |
| 2003/0045164 A1 | * | 3/2003 | Echigo et al. .............. 439/577 |

FOREIGN PATENT DOCUMENTS

| | | |
|---|---|---|
| JP | 6-268345 | 9/1994 |
| JP | 9-324060 | 12/1997 |
| JP | 11-68275 | 3/1999 |

* cited by examiner

Primary Examiner—Jeff H. Aftergut
Assistant Examiner—John T. Haran
(74) Attorney, Agent, or Firm—Knobbe Martens Olson & Bear, LLP

(57) ABSTRACT

The present invention provides a method of manufacturing a wiring board, including the steps of forming a through hole on a prepreg having a releasing resin film on at least one of its surfaces, the prepreg being obtained by impregnating a porous film having a thickness of 5 to 90 μm and a porosity of 30 to 98% with a half cured thermosetting resin, filling the through hole with a conductive paste containing a conductive filler, peeling the resin film, laminating a metal foil on a surface from which the resin film is peeled, and heating and pressurizing the laminated product. Moreover, the present invention provides a wiring board including an insulating layer obtained by impregnating a porous film having a thickness of 5 to 90 μm and a porosity of 30 to 98% with a thermosetting resin and curing them, and a conductive connection structure between wiring layers in which a through hole provided on the insulating layer is filled with a conductive paste, wherein the conductive connection structure has the conductive filler at only a boundary surface with the porous film and in an inner part thereof.

5 Claims, 2 Drawing Sheets

(a)

(b)

(c)

(d)

(e)

(a)

(b)

(c)

(d)

(e)

WIRING BOARD AND METHOD OF MANUFACTURING THE SAME

BACKGROUND OF THE INVENTION

1. Field of the Invention

The present invention relates to a method of manufacturing a wiring board to be suitably used for manufacturing a multilayer wiring board with an inner via hole connection.

2. Description of the Related Art

In recent years, an increase in the density of a wiring board has been required with a reduction in the size and weight of electronic equipment. Correspondingly, the multilayer structure of a wiring layer has been enhanced. As such a structure of the multilayer wiring board, generally, an insulating layer and a wiring layer having a pattern formed thereon are sequentially laminated and the wiring layer is conductively connected through an inner via hole.

A method of manufacturing a multilayer wiring board with the inner via hole connection has been described in Japanese Unexamined Patent Publication No. 6-268345, for example. This method includes the steps of forming a through hole on a prepreg having a releasing film on at least one of the surfaces of the prepreg, filling the through hole with a conductive paste, peeling the releasing film, laminating a metal foil on a surface from which the releasing film is peeled, and heating and pressurizing the laminated product.

As is clearly described in the publication, the prepreg to be used in the method is usually obtained by impregnating a heat-resistant nonwoven fabric such as a polyamide fiber with a thermosetting epoxy resin. In some cases, moreover, a glass fiber impregnated with the thermosetting epoxy resin is used.

If the prepreg obtained by impregnating the heat-resistant nonwoven fabric or the glass fiber with the thermosetting epoxy resin is used, however, the workability of the through hole is apt to be deteriorated by a fiber constituting a nonwoven fabric. Moreover, it is difficult to produce thin and uniform woven and nonwoven fabrics even if the thickness of an insulating layer is to be reduced in order to enhance the workability of a laser via process. Thus, a reduction in the thickness of a layer has been limited.

As described in Japanese Unexamined Patent Publication No. 11-68275, furthermore, the prepreg using a woven fabric or a nonwoven fabric has a problem in that the conductive filler of a conductive paste is apt to flow to the outer peripheral portion of a via hole during heating and pressurizing, resulting in a deterioration in the reliability of a conductive connection and the generation of a short circuit between via holes.

Therefore, it is an object of the present invention to provide a wiring board which is excellent in the workability of a via hole and enhances the reliability of a conductive connection between wiring layers, and a method of manufacturing the same.

SUMMARY OF THE INVENTION

In order to achieve the object, the present inventor vigorously studied the structure, material and thickness of a prepreg and then found that the object can be achieved by using a porous film having a specific structure for the reinforcing phase of the prepreg, thereby finishing the present invention.

More specifically, the present invention provides a method of manufacturing a wiring board, comprising the steps of:

forming a through hole on a prepreg including a releasing resin film on at least one of its surfaces, the prepreg being obtained by impregnating a porous film having a thickness of 5 to 90 μm and a porosity of 30 to 98% with a half cured thermosetting resin;

filling said through hole with a conductive paste containing a conductive filler;

peeling said releasing resin film;

laminating a metal foil on a surface from which said releasing resin film is peeled; and heating and pressurizing the laminated product.

According to the method of manufacturing a wiring board in accordance with the present invention, the workability of the through hole can be more enhanced by using the porous film having a specific thickness and porosity for the reinforcing phase of the prepreg as compared with the case in which a woven fabric or a nonwoven fabric is used for the reinforcing phase. Moreover, the porous film has a three-dimensional bone. Therefore, as compared with the woven fabric or the nonwoven fabric having a one-dimensional fiber aggregate, the conductive filler can be trapped more easily and hardly flows to the outer peripheral portion of the via hole during heating and pressurization. For this reason, the reliability of a conductive connection can be enhanced and a short circuit between the via holes can be prevented more easily. This respect is also apparent from the result of an embodiment. As a result, it is possible to provide a method of manufacturing a wiring board which is excellent in the workability of the via hole and enhances the reliability of a conductive connection between wiring layers.

It is preferable that the porous film has a sponge structure and a mean pore diameter in a section thereof is smaller than the mean particle diameter of the conductive filler. Consequently, the pore structure is comparatively uniform in a portion having the sponge structure and the mean pore diameter in the section is smaller than the mean particle diameter of the conductive filler. Therefore, a leakage from the via hole of the conductive filler can be prevented more reliably so that the reliability of the conductive connection can be enhanced more reliably and the short circuit between the via holes can be prevented. The mean pore diameter in the section is obtained by calculating the diameter of a pore appearing on the whole section of the porous film based on a circular conversion with a number average for the section and is specifically obtained by a measuring method according to the "Example".

On the other hand, the present invention provides a wiring board comprising an insulating layer obtained by impregnating a porous film having a thickness of 5 to 90 μm and a porosity of 30 to 98% with a thermosetting resin and curing them, and a conductive connection structure between wiring layers in which a through hole provided on the insulating layer is filled with a conductive paste, wherein the conductive connection structure has a conductive filler at only a boundary surface with said porous film and in an inner part thereof. According to the wiring board of the present invention, the through hole of the insulating layer is filled with the conductive paste so that the conductive filler is present at only the boundary surface with the porous film and in the inner portion thereof. Therefore, the density of the conductive filler is maintained so that the reliability of the conductive connection can be enhanced. Moreover, a workability can also be enhanced during the formation of the through hole.

DETAILED DESCRIPTION OF THE PREFERRED EMBODIMENTS

A preferred embodiment of the present invention will be described below with reference to the drawings. In the present embodiment, there will be described an example of a step of manufacturing a double-sided metal foil laminated plate in which metal layers are conductively connected by using a prepreg including a resin film on both surfaces.

A prepreg 10 according to the present invention is obtained by impregnating a porous film having a thickness of 5 to 90 μm and a porosity of 30 to 98% with the half cured thermosetting resin. The pore portion of the porous film may be perfectly impregnated with the half cured thermosetting resin. However, when the pore portion is remained, by consolidating the prepreg 10 during heating and pressuring, it is possible to consolidate the conductive paste 6 at the same time. As a method of causing the pore portion to remain, it is preferable that impregnation should be carried out by using the raw material composition of a thermosetting resin in a smaller amount than the volume of the pore portion of the porous film. The prepreg 10 includes a releasing resin film on at least one of surfaces. The material and structure of the prepreg 10 will be described below.

Figure 1:
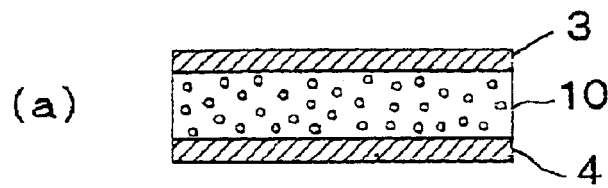
FIG. 1 is a view showing steps according to one embodiment of a method of manufacturing a wiring board in accordance with the present invention.
Figure 1:
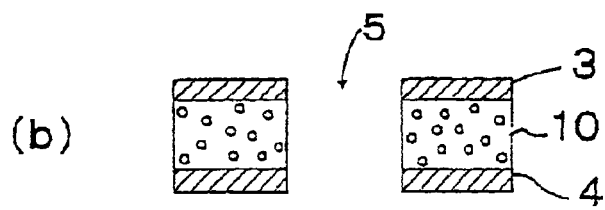
Figure 1:
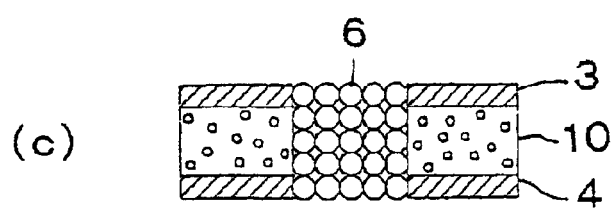
Figure 1:
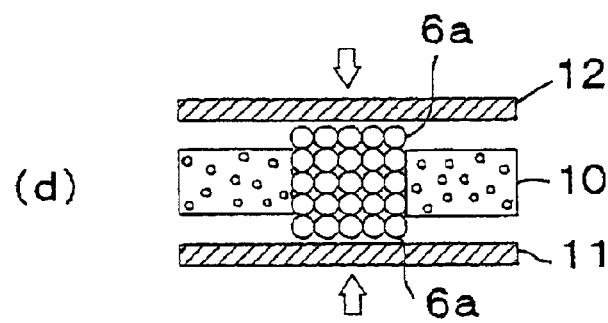
Figure 1:
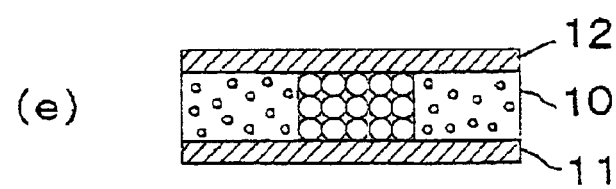

In the present embodiment, as shown in FIG. 1(a), there is prepared the prepreg 10 having resin films 3 and 4 laminated on upper and lower surfaces thereof. Examples of the resin films 3 and 4 include a polyester film such as polyethylene terephthalate or polyethylene naphthalate, a polyolefin film such as polyethylene or polypropylene, a polyamide film and a polyimide film. While a simple lamination arrangement may be carried out, it is preferable that the lamination is performed by utilizing the adhesive strength of the prepreg 10.

As shown in FIG. 1(b), next, a through hole 5 penetrating through the laminated product is formed. Instead of forming the through hole 5 penetrating through the whole laminated product, a metal layer may be provided in place of the resin film 4 and a through hole 5 reaching the metal layer from the surface of the resin film 3 may be formed. Moreover, the metal layer may have a pattern formed previously thereon.

While the through hole 5 can be formed by utilizing drilling or punching through computer control if an opening area is large, laser processing is usually carried out by using various lasers such as a YAG laser. Any conventional method can be applied to a laser processing method, conditions and the like. The resin film 3 also serves to protect the prepreg 10 to be a lower layer during the laser processing.

As shown in FIG. 1(c), then, the through hole 5 is filled with a conductive paste 6 such that the height of a surface is approximately equal to the height of a circumference. Examples of the conductive paste 6 include a conductive filler containing fine particles such as silver, copper, carbon or a solder which is dispersed in a binder resin or a solvent. As a preferable binder resin, a thermosetting resin is suitably used and a curing reaction progresses by thermal pressing which will be described below. Moreover, the mean particle diameter of the fine particle is generally 0.05 to 10 μm.

For the filling of the conductive paste 6, it is possible to use a filling method by printing such as screen printing, offset printing, pad printing, ink jet printing or bubble jet printing or squeezing.

As shown in FIGS. 1(d) and (e), subsequently, the resin film 3 and the resin film 4 are peeled from the prepreg 10 and a convex portion 6a is formed on the conductive paste 6. In this state, two metal layers 11 and 12 are laminated on the upper and lower sides and are heated and pressurized by thermal pressing or the like. The lamination and the heating and pressurizing can also be carried out at the same time. Through this step, the conductive paste 6 is consolidated, so that the contact force between the conductive paste 6 and both of the metal layers 11 and 12 is increased.

Moreover, in the case in which the pore portion of the porous film is remained as described above, the consolidation of the prepreg 10 is caused during the heating and pressurization. Therefore, the conductive paste 6 can be consolidated at the same time. For this reason, it is possible to eliminate the convex portion 6a of the conductive paste 6 in such a case.

For the metal layers 11 and 12, it is possible to use various materials such as copper, cupro-nickel, bronze, brass, aluminum, nickel, iron, stainless, gold, silver and platinum. It is preferable that these metal foils have thicknesses of 1 to 50 μm. In the present invention, it is particularly preferable that a copper foil suitable for the wiring pattern of the wiring board is used. In order to enhance adhesion with the prepreg 10, the surface of the metal foil may be subjected to various physical or chemical surface treatment such as a roughness surfacing process or a blacking process.

Various pressers such as a vacuum pressurizer, a thermal pressurizer and a continuous pressurizer can be utilized for thermal press, and furthermore, any of the conventional known conditions can be applied to the temperature and pressure of the thermal press.

A double-sided metal foil laminated plate obtained as described above can be used as the core substrate of the wiring board and a wiring pattern is formed by a conventional method. In addition, an insulating layer and a wiring layer are further laminated thereto, if necessary, so that a wiring board with a multilayer structure having two layers or more can be manufactured. It is preferable that the wiring pattern is formed by etching a metal foil with an etchant, for example. The etchant is used for the etching depending on the kind of a metal and a dry film resist or the like can be used for pattern etching.

As described above, it is possible to manufacture the wiring board having a conductive connection structure between wiring layers according to the present invention in which a conductive paste is filled in the through hole of an insulating layer obtained by impregnating a porous film having a thickness of 5 to 90 μm and a porosity of 30 to 98% with a thermosetting resin and curing them so that the conductive filler is present at only a boundary surface with the porous film and in an inner portion thereof.

The prepreg according to the present invention will be described below. A resin having an excellent heat resistance and a high mechanical strength is preferable for the material of the porous film to be used in the present invention, and it is possible to employ various resins such as polyimide, polyester, polyamide, particularly, aromatic polyamide, polyamideimide, polyetherimide and polyether sulfone. Above all, a polyimide based resin is preferable because of an excellent insulating property and heat resistance and an excellent adhesion with a metal layer. Moreover, the aromatic polyamide is preferable because of an excellent insulating property and heat resistance and a lower coefficient of thermal linear expansion.

While a porous film may be used alone, it is also possible to form the porous film on the surface of a metal foil such as a copper foil or the surface of a resin film. In particular, the aromatic polyamide has a high adhesion with a polyester film during film formation and the polyester film may be used as a releasing film.

Examples of the method of forming a porous film include a wet coagulation process, a dry coagulation process and a drawing process. In order to obtain a sponge structure, the wet coagulation process is preferable. In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous film is obtained.

The polyamide based resin mainly including a repetition unit in which an acid residue and an amine residue are imide bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous film is to be formed by the wet coagulation process, the polymer having the limiting viscosity within the above range can be formed into a porous film having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether maybe mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous film, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such components are used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N',N'-tetramethyl allonic amide, N-methyl caprolactam, N-acethyl pyrrolidine, N,N-diethyl acetamide, N-ethyl pyrrolidone-2, N,N-dimethyl propionic amide, N,N-dimethyl isobutyl amide, N-methyl formamide, N,N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethyl ether or diethyleneglycol diethyl ether or diethyleneglycol dibutyl ether may be mixed to regulate the speed of a solvent substitution.

Preferably, the doping in the wet coagulation process is carried out by application at a temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an inorganic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous film having a sponge structure expanded uniformly.

The dope is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the case in which a porous film of a polyimide based resin is formed using a precursor thereof (polyamide acid), heat treatment is finally carried out at 200 to 500° C. and the precursor (polyamide acid) is heated and ring-closed to form polyimide.

It is preferable that the porous film according to the present invention has a sponge structure and a mean pore diameter in a section thereof is smaller than the mean particle diameter of the conductive filler. More specifically, it is preferable that the mean pore diameter in the section is 0.01 to 1 μm. In order to impregnate the half cured thermosetting resin, the mean pore diameter of the back face or surface of the porous film is preferably 0.05 μm or more, and more preferably, 0.1 to 1 μm. In order to suitably fulfill the function of the prepreg, the porosity of the porous film is preferably 30 to 98%, and more preferably, 40 to 70%.

The thickness of the porous film is not particularly restricted. If the thickness is too great, a long time tends to be taken for the elimination of a solvent. Moreover, it has recently been desired that a multilayer wiring board should be thin, light and have a high mechanical strength. Therefore, it is preferable that the thickness should be from 90 μm to 5 μ

While the porous film is obtained through the above-mentioned steps in the present invention, it is possible to obtain a prepreg impregnated with the half cured thermosetting resin by impregnating the inside of the pore with the raw material composition of the thermosetting resin. The half cured thermosetting resin may be impregated into the pore of the porous film partially or entirely. In respect of the handling property and workability of the prepreg, it is preferable that the impregnation rate of the half cured thermosetting resin is 25 to 100% for the pore portion of the porous film. Moreover, the half cured thermosetting resin may be formed like a layer and a part thereof may be impregnated in the pore of the porous film. In that case, the impregnation rate of the half cured substance may be less than the above-mentioned range.

For a method of impregnating the raw material composition, it is possible to employ a method of directly applying a raw material solution of a thermosetting resin on the surface of a porous film by means of various coaters. However it is preferable to use a method in which a solid coated film obtained by coating the surface of a base material sheet with a raw material solution and drying the same surface is provided on the surface of the porous film and is impregnated by heating and pressurization. According to this method, it is possible to prevent aromatic polyamide from being swollen to deform the porous film due to a solvent contained in the raw material solution of the thermosetting resin.

Examples of the thermosetting resin include an epoxy resin, a phenol resin, a polyimide resin or polyamide acid. The epoxy resin, a mixture of the epoxy resin and other resins and the like are preferable in respect of a price and handling. The raw material solution of the thermosetting resin may contain a catalyst, a curing agent, a flame retardant, a filler, a plasticizer and an accelerator in addition to a solvent. Examples of the solvent contained in the raw material solution of the thermosetting resin include ketones, acetates, ethers, aromatic hydrocarbons, alcohols depending on the kind of the thermosetting resin.

A resin and a metal can be used for the base material sheet and a resin film is preferable. Examples of the coating method include coating methods using a blade coater, a comma coater, a roll coater, a calender coater and a bar coater in the case of direct coating or indirect coating. If a coating thickness is uniform, the thickness of the solid coated film is also uniform and the amount of impregnation can be uniform.

In order to dry the solvent, the solvent does not need to be removed completely but may be simply non-fluidized. For a drying method, heating drying and hot-air drying are preferable in respect of efficiency. Such a temperature that the curing reaction of the thermosetting resin does not progress excessively can be selected for a heating temperature.

Example of the heating and pressurizing method include a method using various thermal pressers and thermal laminators, apparatuses obtained by adding an evacuator thereto and the like. In the present invention, the thermal laminator is preferably used. By the heating and pressurizing operation, it is possible to manufacture a prepreg in which a porous film is impregnated with the half-cured substance of a thermosetting resin.

[Another Embodiment]

Another embodiment of the present invention will be described below.

Figure 2:
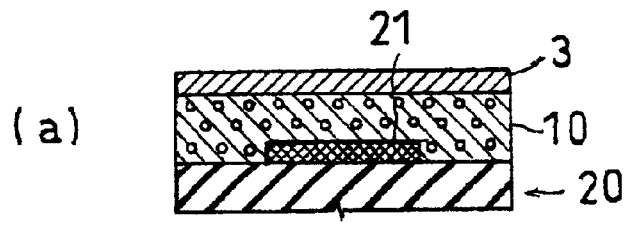
FIG. 2 is a view showing steps according to another embodiment of the method of manufacturing a wiring board in accordance with the present invention.
Figure 2:
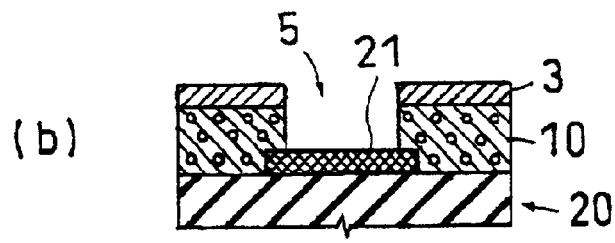
Figure 2:
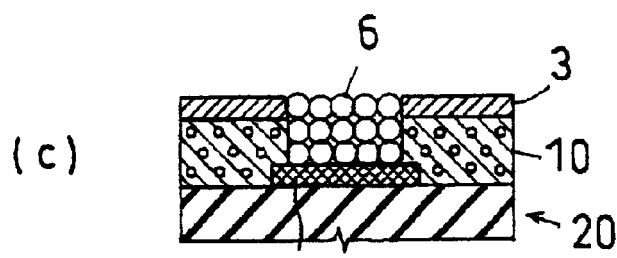
Figure 2:
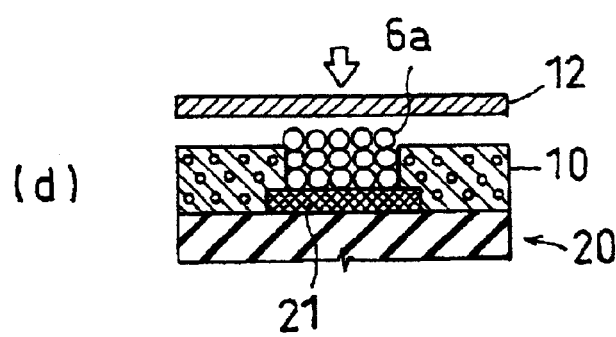
Figure 2:
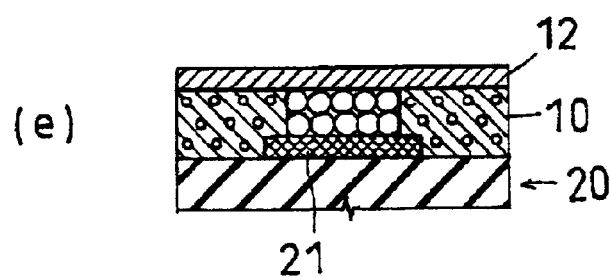

(1) While the example in which a double-sided metal foil laminated plate having metal layers connected conductively is manufactured by using a prepreg including a resin film on both surfaces has been described in the above-mentioned embodiment, as shown in FIG. 2, a prepreg 10 including a resin film 3 on one surface may be provided on a laminated product 20 having a wiring pattern 21 to manufacture a multilayer wiring board.

In the present embodiment, first of all, the prepreg 10 including the resin film 3 on one surface is provided on the laminated product 20 having the wiring pattern 21 as shown in FIG. 2(a). In that case, it is preferable that the half cured thermosetting resin impregnated in the prepreg 10 is not completely cured but attached by pressure.

As examples of the laminated product 20 having the wiring pattern 21, the wiring pattern 21 is formed against the metal foil of the core substrate consisting of a double-sided metal foil laminated plate and a wiring layer to be an upper layer is further provided through an insulating layer. Examples of the insulating layer of the core substrate include a glass-containing epoxy resin, a phenol resin, a BT resin, a polyimide resin and the like. Moreover, the core substrate may be manufactured by the steps shown in FIGS. 1(a) to (e).

As shown in FIG. 2(b), next, a through hole 5 reaching the wiring pattern 21 from the surface of the resin film 3 is formed in the upper part of the wiring pattern 21 in the same manner as in the above-mentioned embodiment.

As shown in FIGS. 2(c) to (e), subsequently, it is preferable to execute the steps of filling the through hole 5 with a conductive paste 6 containing a conductive filler, peeling the resin film 3, laminating a metal foil 12 on a surface from which the resin film 3 is peeled, and heating and pressurizing the laminated product.

While a laminated plate having a metal foil 12 laminated integrally on a surface is obtained through these steps, it is possible to manufacture a multilayer wiring board having a conductive connection structure between wiring layers according to the present invention by forming a pattern against the metal foil 12 through etching or the like and sequentially repeating the above steps. The steps are generally carried out for both surfaces of the core substrate. In that case, it is possible to obtain a multilayer wiring board having wiring layers provided on upper and lower sides.

EXAMPLE

Description will be given to examples specifically showing the feature and effect of the present invention. The mean pore size and the vacancy rate of a porous film were measured in the following manner.

(1) Mean Pore Size of Porous Film

A mean pore size on a surface was obtained by photographing the surface of a porous film by means of a scanning electron microscope (SEM) and analyzing the image of the picture by means of a computer.

A mean pore size of a section was obtained by photographing the section of a porous film by means of a scanning electron microscope (SEM) and analyzing the image of the picture by means of a computer with the above-mentioned calculation method.

(2) Void Content of Porous Film

Void content (%)={1−(weight/density)/volume}×100

The volume and the weight of a porous film were measured and a void content was calculated by the above equation using the density of a porous film material.

Example 1

A hexane solution of isophthalic chloride and an m-phenylene diamine aqueous solution were caused to react equimolarly so that aromatic polyamide was obtained. The aromatic polyamide (precipitate) was repeatedly washed by water and alcohol and water and was then dried in vacuum overnight at 60° C. so that a dry polymer was obtained. The polymer was dissolved in N-methyl-2-pyrrolidone (NMP), and furthermore, polyvinyl pyrrolidone (PVP) (manufactured by ISP JAPAN CO., LTD., K-90) and water were mixed so that a polymer solution (film forming solution) containing aromatic polyamide (100 parts by weight), NMP (900 parts by weight), PVP (40 parts by weight) and water (40 parts by weight) was obtained.

A PEN film having a thickness of 12 μm (manufactured by TEIJIN LIMITED, Teonex film) was coated with the solution in a thickness of 30 μm, and was immersed in a water tank at 60° C. to form a porous film. Furthermore, the film was preserved for twenty-four hours to eliminate a solvent. Thereafter, the film was dried at 80° C. for five hours so that a porous film stuck and formed integrally with the PEN film was obtained. The porous film thus obtained had a sponge structure in which a continuous hole having a thickness of 28 μm is formed. A mean pore size of a section of 0.02 μm, a mean pore size of a surface of 0.02 μm and a vacancy rate of 50% were obtained.

For the porous film, a thermosetting resin composition comprising a 50% by weight solution of methylethyl ketone of a brominated bisphenol A-type epoxy resin was coated and impregnated in the porous film side. As a result, an excellent impregnating property could be obtained.

A punched hole having a size of 200 μm was formed on the prepreg and a conductive paste (50 vol % of solder powder having a mean particle diameter of approximately 8 μm and 50 vol % of a solvent) was squeezed and filled on the PEN side. At this time, the PEN film was tried to be peeled, so that it could be peeled on an interface easily. After the peeling, a copper foil was pressed and bonded onto both surfaces at 60 kg/cm² and 180° C. to create a double-sided substrate. Thus, it was confirmed that a via was conducted. The via had a size of 160 μm and did not expand the hole having a size of 200 μm.

The section of the portion in which the via was formed was observed by means of a scanning electron microscope (SEM). As a result, the solder powder did not leak into the inner part of the porous film but was present only at a boundary surface with the porous film and in an inner part thereof.

Comparative Example 1

By using an aromatic polyamide nonwoven fabric (manufactured by SHIN-KOBE ELECTRIC MACHINERY CO., LTD, Type EA-541, a fiber diameter of 10 μm) in place of the porous film consisting of aromatic polyamide, an epoxy resin was impregnated to fabricate a prepreg in the same manner as in the first example. After the via processing was carried out and then a conducive paste was filled, a copper foil was pressed and bonded to fabricate a double-sided substrate.

The section of a portion in which the via was formed was observed by means of a scanning electron microscope (SEM), solder powder leaked into the fibers of a nonwoven fabric so that there was no boundary surface with the nonwoven fabric. As compared with the example 1, accordingly, there is a possibility that the reliability of a conductive connection might be deteriorated and a short circuit might be easily caused between the via holes.

What is claimed is:

1. A method of manufacturing a wiring board, comprising the steps of:

forming a through hole on a prepreg including a releasing resin film on at least one of its surfaces, the prepreg being obtained by impregnating a porous film having a thickness of 5 to 90 μm and a porosity of 30 to 98% with a half cured thermosetting resin;

filling said through hole with a conductive paste containing a conductive filler;

peeling said releasing resin film;

laminating a metal foil on a surface from which said releasing resin film is peeled; and heating and pressurizing the laminated product, wherein said porous film has a sponge structure with a three-dimensional bone, and a mean pore diameter in a section thereof is 0.01 to 1 μm and is smaller than a mean particle diameter of said conductive filler.

2. The method of manufacturing a wiring board according to claim 1, wherein said porous film comprises polyimide or aromatic polyamide.

3. A method of manufacturing a wiring board, comprising the steps of:

impregnating a porous film formed on a releasing resin film with a half cured thermosetting resin to obtain a prepreg, said porous film having a thickness of 5 to 90 μm and a porosity of 30 to 98%;

forming a through hole through the releasing resin film and the prepreg;

filling and leveling the through hole with a conductive paste containing conductive filler particles;

removing the releasing resin film from the prepreg, wherein the conductive paste protrudes from a surface from which the releasing resin film has been removed;

laminating a metal foil on the surface to obtain a laminated product; and pressurizing and heating the laminated product to cure the prepreg and the conductive paste, wherein said porous film has a sponge structure with a three-dimensional bone, and a mean pore diameter in a section of said porous film is 0.01 to 1 μm and is smaller than a mean particle diameter of said conductive filler.

4. The method according to claim 3, wherein the mean particle diameter of the filler particles is 0.05 to 10 μm.

5. The method according to claim 3, wherein the porous film is composed of polyimide or aromatic polyamide.

* * * * *